(12) United States Patent
Ogura et al.

(10) Patent No.: US 7,706,554 B2
(45) Date of Patent: Apr. 27, 2010

(54) ELECTRET CONDENSER

(75) Inventors: Hiroshi Ogura, Tokyo (JP); Tohru Yamaoka, Osaka (JP)

(73) Assignee: Panasonic Corporation, Osaka (JP)

(*) Notice: Subject to any disclaimer, the term of this patent is extended or adjusted under 35 U.S.C. 154(b) by 218 days.

(21) Appl. No.: 10/591,456

(22) PCT Filed: Feb. 24, 2005

(86) PCT No.: PCT/JP2005/003030

§ 371 (c)(1),
(2), (4) Date: Sep. 1, 2006

(87) PCT Pub. No.: WO2005/086534

PCT Pub. Date: Sep. 15, 2005

(65) Prior Publication Data

US 2007/0217635 A1    Sep. 20, 2007

(30) Foreign Application Priority Data

Mar. 3, 2004    (JP) .............................. 2004-058435

(51) Int. Cl.
*H04R 25/00* (2006.01)
*H01L 29/78* (2006.01)
(52) U.S. Cl. .................... 381/175; 381/174; 381/191; 257/416
(58) Field of Classification Search ................. 381/191, 381/396, 178, 174, 175; 257/416, E29.324; 29/594
See application file for complete search history.

(56) References Cited

U.S. PATENT DOCUMENTS

| 3,946,422 | A |   | 3/1976  | Yagi et al. |
|-----------|---|---|---------|-------------|
| 4,142,073 | A | * | 2/1979  | Agneus et al. .............. 381/174 |
| 4,441,038 | A |   | 4/1984  | Tanaka et al. |
| 5,452,268 | A |   | 9/1995  | Bernstein |
| 5,490,220 | A |   | 2/1996  | Loeppert |
| 5,573,679 | A |   | 11/1996 | Mitchell et al. |
| 5,677,965 | A |   | 10/1997 | Moret et al. |
| 6,383,832 | B1|   | 5/2002  | Nakabayashi |

(Continued)

FOREIGN PATENT DOCUMENTS

CN    2061748 U    9/1990

(Continued)

OTHER PUBLICATIONS

T. Majamaa et al., Effect of Oxidation Temperature on the Electrical Characteristics of Ultrathin Silicon Dioxide Layers Plasma Oxidized in Ultrahigh Vacuum, 1999, Physica Scripta, vol. T79, 259-262.*

(Continued)

*Primary Examiner*—Curtis Kuntz
*Assistant Examiner*—Jesse A Elbin
(74) *Attorney, Agent, or Firm*—McDermott Will & Emery LLP

(57) ABSTRACT

An electret condenser 2 includes a fixed electrode 6, a vibrating electrode 5, an electretized silicon dioxide film 7 formed between the electrodes, and silicon nitride films 8 and 9 formed so as to cover the silicon dioxide film 7. The silicon dioxide film 7 covered with the silicon nitride films 8 and 9 is formed on the vibrating electrode 5.

15 Claims, 2 Drawing Sheets

U.S. PATENT DOCUMENTS

| | | |
|---|---|---|
| 6,586,163 B1 | 7/2003 | Okabe et al. |
| 6,622,368 B1 | 9/2003 | Mullenborn |
| 6,731,766 B2 | 5/2004 | Yasuno et al. |
| 6,847,090 B2 | 1/2005 | Loeppert |
| 6,859,542 B2 | 2/2005 | Johannsen et al. |
| 6,870,937 B1 | 3/2005 | Hirosaki et al. |
| 6,928,178 B2 | 8/2005 | Chang |
| 7,039,202 B1 | 5/2006 | Takeuchi |
| 7,301,213 B2 | 11/2007 | Matsubara et al. |
| 7,386,136 B2 | 6/2008 | Ohbayashi et al. |
| 2001/0033670 A1* | 10/2001 | Tai et al. ............... 381/174 |
| 2002/0081846 A1 | 6/2002 | Haruhana et al. |
| 2002/0172382 A1 | 11/2002 | Nakabayashi |
| 2002/0180047 A1 | 12/2002 | Haruhana et al. |
| 2002/0181725 A1* | 12/2002 | Johannsen et al. ....... 381/174 |
| 2003/0015798 A1 | 1/2003 | Haruhana et al. |
| 2003/0026443 A1 | 2/2003 | Yasuno et al. |
| 2004/0114775 A1* | 6/2004 | Chang ................... 381/191 |
| 2004/0259286 A1* | 12/2004 | Dehe et al. ............. 438/50 |
| 2005/0254673 A1* | 11/2005 | Hsieh et al. ............ 381/191 |
| 2006/0145570 A1 | 7/2006 | Ohbayashi et al. |
| 2007/0029894 A1 | 2/2007 | Yamaoka et al. |
| 2007/0189555 A1 | 8/2007 | Yamaoka et al. |

FOREIGN PATENT DOCUMENTS

| | | |
|---|---|---|
| CN | 2279929 Y | 4/1998 |
| CN | 1299152 A | 6/2001 |
| JP | 09-283373 | 10/1997 |
| JP | 11-331988 A | 11/1999 |
| JP | 2002-027595 | 1/2002 |
| JP | 2002-033241 | 1/2002 |
| JP | 2002-209298 | 7/2002 |
| JP | 2002-223499 | 8/2002 |
| JP | 2002-320294 | 10/2002 |
| JP | 2002-335599 | 11/2002 |
| JP | 2003-031820 | 1/2003 |
| JP | 2004-510373 A | 4/2004 |
| JP | 2004-166262 | 6/2004 |
| JP | 2004-356707 | 12/2004 |
| WO | WO 99/65277 | 12/1999 |
| WO | WO 02/37893 A1 | 5/2002 |

OTHER PUBLICATIONS

E.C.Ross et al., Effects of Silicon Nitride Growth Temperature on Charge Storage in the MNOS Structure, 1969, Applied Physics Letters, vol. 15 No. 12, 408-409.*

United States Office Action issued in Patent Application No. 10/576,518 dated on Sep. 11, 2008.

United States Office Action issued in U.S. Appl. No. 10/591,597 dated on Sep. 26, 2008.

United States Office Action, issued in U.S. Appl. No. 10/591,597, dated Apr. 8, 2009.

United States Office Action issued in U.S. Appl. No. 10/576,518, mailed Mar. 2, 2009.

European Search Report issued in European Patent Application No. EP 04818870.0, mailed Mar. 12, 2009.

Chinese Office Action, with English Translation, issued in Chinese Patent Application No. CN 200480034059.7, dated Jun. 19, 2009.

United States Office Action issued in U.S. Appl. 10/591,597, mailed Nov. 20, 2009.

* cited by examiner (a)

(b)

(a)

(b)

ized; and a second insulating film formed so as to cover the first insulating film, wherein the first insulating film covered with the second insulating film is formed on the second electrode.

ELECTRET CONDENSER

RELATED APPLICATIONS

This application is the U.S. National Phase under 35 U.S.C. §371 of International Application No. PCT/JP2005/003030, filed on Feb. 24, 2005, which in turn claims the benefit of Japanese Application No. 2004-058435, filed on Mar. 3, 2004, the disclosures of which Applications are incorporated by reference herein.

TECHNICAL FIELD

The present invention relates to an electret condenser including a vibrating electrode and more particularly relates to an electret condenser formed using a MEMS (Micro Electro Mechanical Systems) technology.

BACKGROUND ART

Conventionally, organic high-molecular polymers, such as FEP (Fluorinated Ethylene Propylene) materials have been used for electret elements which are dielectric materials each having a permanent electric polarization and applied to devices, such as a condenser microphone. These materials, however, have poor thermal resistance and, therefore, are difficult to use as elements for reflow when mounted on substrates.

In order to achieve a small-size microphone, an electret condenser microphone was proposed recently which uses as the electret element a silicon dioxide film processed by a microfabrication technology rather than the organic high-molecular polymers (see Patent Document 1). Specifically, in this electret condenser microphone, two silicon substrates are joined to each other as a condenser, an electret film formed of a silicon dioxide film as an electret material is arranged at one of the substrates.

Patent Document 1: Japanese Patent Application Laid Open Publication No. 11-331988A

PROBLEMS THAT THE INVENTION IS TO SOLVE

However, the electret condenser microphone having the structure disclosed in Patent Document 1 involves the following problems.

Namely, with a silicon dioxide film as an electret, which functions to absorb moisture or the like in the air, charge dissipates from the electret. Also, only such a modification to form a silicon dioxide film cannot attain an electret with no chronological change. Further, when the electret is heated, the charge dissipates from an exposed part of the silicon dioxide film. Since the charge of the electret dissipates from the exposed part of the silicon dioxide film, for example, in mounting the microphone with the electret condenser to another substrate by a reflow process, the microphone is inhibited from sufficiently displaying its function.

The present invention has its object of providing an electret condenser having a structure excellent in moisture resistance and providing an electret condenser composed of an electret having high thermal resistance and permanent charge.

MEANS FOR SOLVING THE PROBLEMS

To attain the above objects, a first electret condenser according to the present invention includes: a first electrode; a second electrode; a first insulating film which is formed between the first electrode and the second electrode and is electretized; and a second insulating film formed so as to cover the first insulating film, wherein the first insulating film covered with the second insulating film is formed on the second electrode.

Also, a second electret condenser according to the present invention includes: a first electrode; a second electrode; and a first insulating film which is formed between the first electrode and the second electrode and is electretized, wherein the first insulating film is covered with the second electrode and a second insulating film, and the second electrode is made of polysilicon.

In the first or second electret condenser, the first insulting film may be a silicon dioxide film grown in an atmosphere at a temperature in a range between 500° C. and 800° C., both inclusive.

In the first or second electret condenser, the second insulting film may be a silicon nitride film grown in an atmosphere at a temperature in the range between 600° C. and 800° C., both inclusive In the first or second electret condenser, the second electrode, the first insulating film, and the second insulating film may compose a vibrating film. In this case, it is preferable that a shape in plan of the first insulating film is smaller than a shape in plan of the vibrating film and the first insulating film is arranged at a central part of the vibrating film.

EFFECTS OF THE INVENTION

In the present invention, the electretized first insulating film, which is a silicon dioxide film or the like that has become an electret by electro-depositing charge, is covered with, for example, the second insulating film of a silicon nitride film or the like or the second insulating film and the second electrode. Accordingly, absorption of moisture and the like in the air by the first insulating film and dissipation of the charge from the first insulting film at heating can be suppressed. Hence, an electret condenser excellent in reliability, such as moisture resistance, thermal resistance can be provided.

Figure 1:
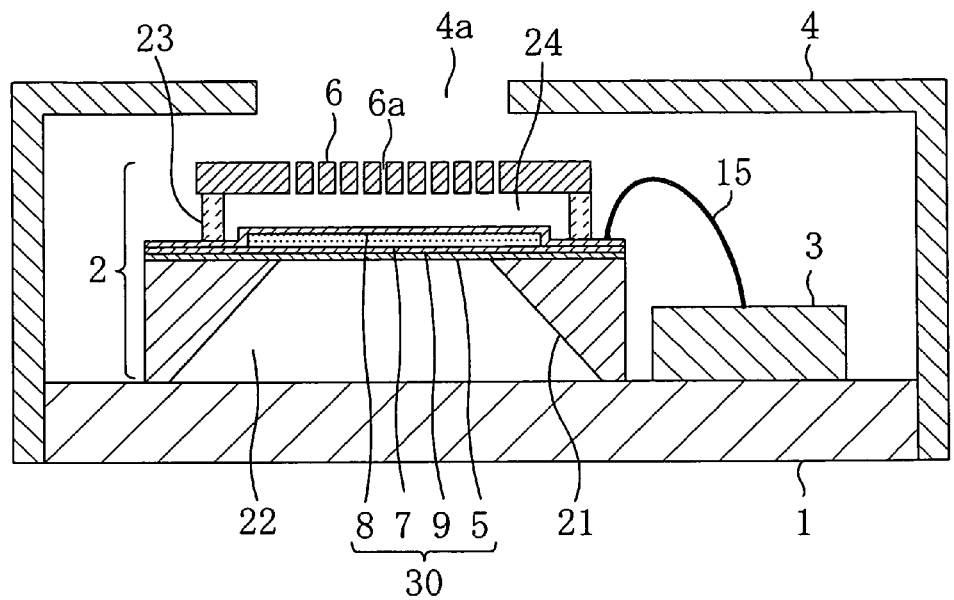
FIG. 1 is a section of an electret condenser microphone (ECM) carrying an electret condenser according to one embodiment of the present invention.

EXPLANATION OF REFERENCE NUMERALS 1 resin substrate
2 electret condenser
3 IC
4 shielding case 4a opening
5 vibrating electrode
6 fixed electrode
6a acoustic hole
7 silicon dioxide film
8 silicon nitride film
9 silicon nitride film
10 conductive film
11 silicon substrate
15 bonding wire
21 substrate
22 cavity
23 insulating film
24 air gap
30 vibrating film

BEST MODE FOR CARRYING OUT THE
INVENTION

An electret condenser according to one embodiment of the present invention will be described below with reference to the accompanying drawings.

First of all, an electret condenser microphone (ECM) carrying the electret condenser according to the present embodiment will be described.

FIG. 1 is a section showing a construction of the ECM carrying the electret condenser according to the present embodiment. As shown in FIG. 1, an electret condenser (the electret condenser according to the present embodiment) 2 and an IC (integrated circuit) 3 are arranged on a resin substrate 1, and a shielding case 4 is mounted over the resin substrate 1 so as to cover the electret condenser 2 and the IC 3. The electret condenser 2 and the IC 3 are connected to each other electrically via a bonding wire 15.

The electret condenser 2 is mainly composed of a vibrating electrode 5 and a fixed electrode 6.

Specifically, on a substrate 21 arranged on the resin substrate 1 and having a cavity 22, the vibrating electrode 5 is formed so as to cover the cavity 22. An electretized silicon dioxide film 7 (a film that has become an electret by being charged) is formed on the vibrating electrode 5 with a silicon nitride film 9 interposed therebetween. The silicon dioxide film 7 is arranged on the central part of the vibrating electrode 5. Further, a silicon nitride film 8 is formed so as to cover the silicon dioxide film 7. Accordingly, the silicon dioxide film 7 is completely covered with the silicon nitride film 8 and the silicon nitride film 9. In the present embodiment, the vibrating electrode 5, the silicon nitride film 9, the silicon dioxide film 7, and the silicon nitride film 8 vibrate integrally to serve as a vibrating film 30.

The fixed electrode 6 is formed above the vibrating film 30 with an insulating film 23 serving as a spacer interposed therebetween. In other words, the silicon dioxide film 7 covered with the silicon nitride films 8 and 9 and an air gap 24 formed by partially removing the insulating film 23 intervene between the vibrating electrode 5 and the fixed electrode 6. In the fixed electrode 6, a plurality of acoustic holes 6a are formed so as to communicate with the air gap 24. Further, an opening 4a is formed at a part of the shielding case 4 facing the fixed electrode 6 so that the acoustic holes 6, receive sound pressure from the external space.

Figure 2:
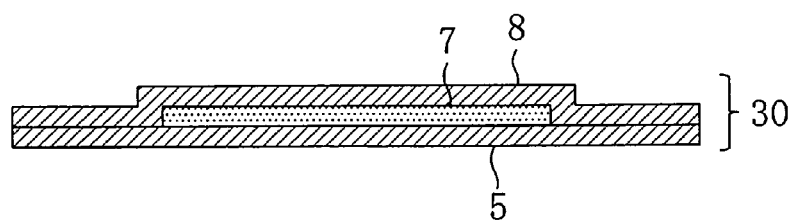
FIG. 2(a) and FIG. 2(b) are diagrams showing variation on sectional structures of a vibrating film in the electret condenser according to the embodiment of the present invention.
Figure 2:
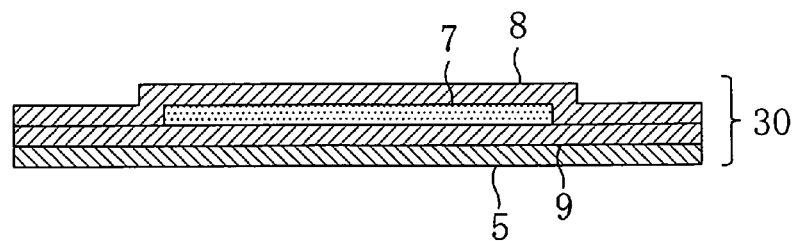

FIG. 2(a) and FIG. 2(b) are diagrams showing variation on sectional structures of the vibrating film in the electret condenser according to the present embodiment, wherein FIG. 2(b) a section showing in an enlarged scale the film structure of the vibrating film 30 shown in FIG. 1.

As shown in FIG. 2(a), the vibrating film 30 may be formed in such a manner that the electrified silicon dioxide film 7 is formed on the vibrating electrode 5 and the silicon nitride film 8 is formed so as to cover this silicon dioxide film 7.

Alternatively, as shown in FIG. 2(b), the vibrating film 30 may be formed in such a manner that the silicon nitride film 9 is formed on the vibrating electrode 5, the electrified silicon dioxide film 7 is formed thereon, and then, the silicon nitride film 8 is formed so as to cover this silicon dioxide film 7.

In the vibrating film 30 shown in FIG. 2(a), the electret formed of the electrified silicon dioxide film 7 is completely covered with the vibrating electrode 5 and the silicon nitride film 8. As to the vibrating film 30 shown in FIG. 2(b), the electret formed of the electrified silicon dioxide film 7 is completely covered with the silicon nitride film 9 and the silicon nitride film 8. Either structures shown in FRY 2(a) or FIG. 2(b) attain suppression of absorption of moisture in the air by the silicon dioxide film 7 and of dissipation of charge from the silicon dioxide film 7 at heating.

The present inventors carried out an experiment for verifying the effects obtained by completely covering the silicon dioxide film 7 with the vibrating electrode 5 and the silicon nitride film 8 or with the silicon nitride film 9 and the silicon nitride film 8, as shown in FIG. 2(a) or FIG. 2(b). The results of the experiment will be described with reference to FIG. 3(a) and FIG. 3(b).

Figure 3:
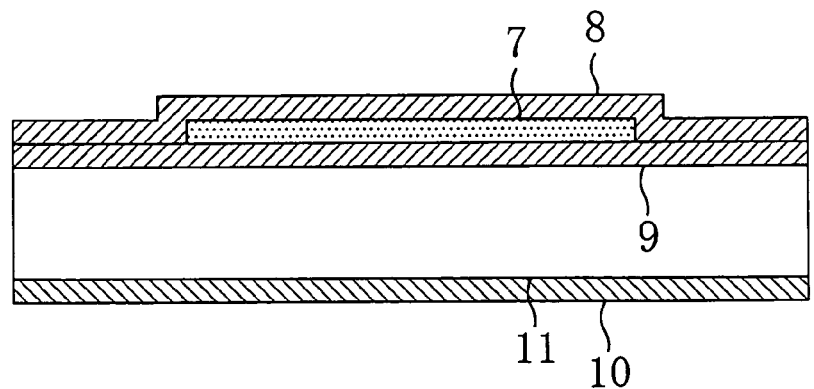
FIG. 3(a) is a section showing a structure of a film used in verification of effects obtained by covering an electretized silicon dioxide film with other insulating films in the electret condenser according to the embodiment of the present invention.
FIG. 3(b) is a section showing a film structure where an electretized silicon dioxide film is exposed to an atmosphere, which is used as a comparative example in the above verification.
Figure 3:
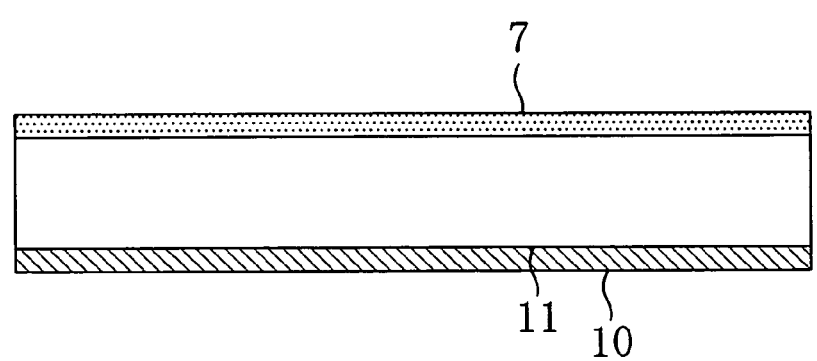

FIG. 3(a) is a section showing a structure of a film used in the verification of the effects obtained by completely covering the electrified silicon dioxide film 7 with the silicon nitride films 8 and 9 in the electret condenser 2 of the present embodiment. FIG. 3(b) is a section showing a film structure where the electrified silicon dioxide film 7 is exposed to an atmosphere, as a comparative example in the aforementioned verification. In each film structure in FIG. 3(a) or FIG. 3(h), the silicon dioxide film 7 is formed on the obverse face of a silicon substrate 11, on the reverse face of which a conductive film (Al film) 10 is formed.

Specifically, the silicon dioxide film 7 is an LP-TEOS (low pressure-tetraethylorthosilicate) film formed under reduced pressure to have a thickness of 1.5 μm. It is noted that the temperature for forming the silicon dioxide film 7 by, for example, reduced pressure CVD (Chemical Vapor Deposition) is preferably set in the range between 500° C. and 800° C., both inclusive.

Further, in the film structure shown in FIG. 3(a), the above-described silicon dioxide film 7 is completely covered with the silicon nitride films 8 and 9, which are LP-SiN films formed under reduced pressure. Thus, with the use of the LP-SiN films formed by, for example, reduced pressure CVD at a high temperature as the silicon nitride films 8 and 9, the silicon nitride films 8 and 9 can serve as dense protection films with no pin hole and the like. Specifically, the temperature for growing the silicon nitride films 8 and 9 by, for example, reduced pressure CVD is preferably set in the range between 600° C. and 800° C., both inclusive.

The verification by the present inventors shows that in the film structure in which the silicon dioxide film 7 to which charge is electro-deposited is exposed to the atmosphere (i.e., the film structure of the comparative example shown in FIG. 3(b)), a 44-hour shelf test reduced the amount of electrodeposition of the silicon dioxide film 7 by approximately 8 dB. In contrast, in the film structure in which the silicon dioxide film 7 to which charge is electro-deposited is completely covered with the silicon nitride film 8 and the silicon nitride film 9 (i.e., the film structure of the present embodiment shown in FIG. 3(a)), the reduced amount of electrodeposition of the silicon dioxide film 7 was only approximately 0.4 dB after the 44-hour shelf test, for example. Further, even after the film structure of the present embodiment additionally underwent one-hour heating in an atmosphere at a temperature of 150° C., the amount of electrodeposition of the silicon dioxide film 7 was reduced by approximately 0.1 dB at utmost. In other words, with the film structure of the present embodiment, remarkable suppression can be observed in absorption of moisture and the like in the air by the silicon dioxide film 7 and in charge dissipation from the silicon dioxide film 7 at heating, compared with the film structure of the comparative example.

As described above, in the present embodiment, the electretized silicon dioxide film 7 is covered with the silicon nitride films 8 and 9 or with the silicon nitride film 8 and the vibrating electrode 5, so that absorption of moisture and the like in the air by the silicon dioxide film 7 and charge dissipation from the silicon dioxide film 7 at heating can be suppressed. Hence, an electro condenser 2 excellent in reliability, such as moisture resistance and thermal resistance can be provided.

The principal of resonance frequency control for the vibrating film 30 will be described below by referring as an example to the case where the vibrating film 30 of the present embodiment is composed of the silicon dioxide film 7 formed of a LP-TEOS film, the silicon nitride films 8 and 9 formed of LP-SiN films, and the vibrating electrode 5 formed of a polysilicon film (a so-called polysilicon-doped film) to which an impurity is doped (see FIG. 2(b)).

Figure 4:
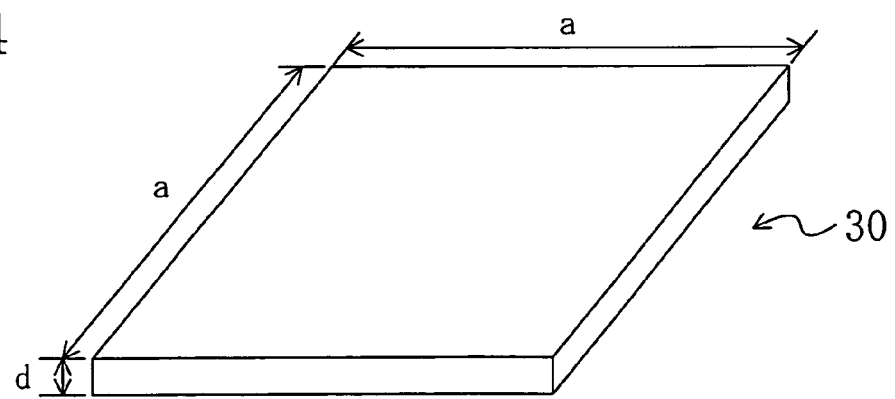
FIG. 4 is a diagram schematically showing the shape of the vibrating film of the electret condenser according to the embodiment of the present embodiment.

FIG. 4 is a diagram schematically showing the shape of the vibrating film 30 of the present embodiment. Suppose that the vibrating film 30 is a quadratic film in a square shape having a side length of a and a thickness of d. The resonance frequency f of the quadratic film can be expressed by:

$$f = 1/\{2\pi \cdot (M \cdot C)^{1/2}\} \qquad \text{(Expression 1)}.$$

Wherein, M is a mass of the vibrating film 30, and C is a compliance expressing mobility of the vibrating film 30. Also, M and C are obtained from the following expressions, respectively:

$$M(\pi^4 \cdot \rho \cdot d \cdot a^2)/64 \qquad \text{(Expression 2)}$$

$$C = 32/(\pi^6 \cdot T) \qquad \text{(Expression 3)}.$$

Wherein, $\rho$ is a density of the vibrating film 30, and T is a tension of the vibrating film 30. Further, the tension T can be obtained from:

$$T = \sigma \cdot d \qquad \text{(Expression 4)},$$

wherein $\sigma$ is a stress of the vibrating film 30.

Assignment of (Expression 2), (Expression 3), and (Expression 4) to (Expression 1) leads to expression of f as:

$$f = (0.71/a) \cdot (\sigma/\rho)^{1/2} \qquad \text{(Expression 5)}$$

(Expression 1) to (Expression 5) are the expressions on the assumption that the vibrating film 30 is a single-layer film. In the case where the vibrating film 30 is a multilayer film (a film formed of n layers (n is an integer larger than 1)), d, $\sigma$, and $\rho$ are respectively obtained as:

$$d = \Sigma di \text{ (i is an integer from 1 to n)} \qquad \text{(Expression 6)}$$

$$\sigma = \Sigma(\sigma i/di)/di \text{ (i is an integer from 1 to n)} \qquad \text{(Expression 7)}$$

$$\rho = \Sigma(\rho i/di)/di \text{ (i is an integer from 1 to n)} \qquad \text{(Expression 8)},$$

and then, are used in (Expression 1) to (Expression 5).

For example, on the assumption that: an area of the quadratic film to be the vibrating film 30 is 1 mm² (a=1 mm); the film thickness d1 of the LP-TEOS film to be the silicon dioxide film 7 (stress ($\sigma 1$ (Expression 7)): $-110 \times 10^6$ [N/m²] and density ($\rho 1$ in (Expression 8)): $2.5 \times 10^3$ [kg/m³]) is 1500 nm; each film thickness d2 of the LP-SiN films to be the silicon nitride films 8 and 9 (stress ($\sigma 2$ in (Expression 7)): $1200 \times 10^6$ [N/m²] and density ($\rho 2$ in (Expression 8)): $3.1 \times 10^3$ [kg/m³]); and a film thickness d3 of the polysilicon film to be the vibrating electrode 5 (stress ($\sigma 3$ in (Expression 7)): $-0.3$ [N/m²] and density ($\rho 3$ in (Expression 8)): $2.3 \times 10^3$ [kg/m³] is 200 nm, the resonance frequency f is calculated to be 178 kHz from (Expression 1) through (Expression 8). Accordingly, when the LP-TEOS film and the LP-SiN films are changed in thickness on the basis of this value as a standard resonance frequency f0, the resonance frequency f can be controlled.

As shown in FIG. 1, the electret condenser 2 of the present embodiment serves as a component pan of the microphone. The microphone changes sound pressure to an electric signal in the frequency band of 2 to 20 kHz, which is the audible region. Accordingly, the vibrating film 30 of the electret condenser 2 must have a resonance frequency f higher than 20 kHz, the upper limit of the frequency band. Otherwise, it exhibits insufficient sensitivity to be of no use as a component part of the microphone. In the present embodiment, as described above, when each film thickness of the silicon dioxide film 7 and the silicon nitride films 8 and 9, which compose the vibrating film 30, is adjusted, the vibrating film 30 having a resonance frequency f over 20 kHz can be formed.

It is noted that the polysilicon film to be the vibrating electrode 5 has less stress, and therefore, hardly contributes to control of the resonance frequency f of the vibrating film 30.

As described above, according to the present embodiment, control of each film thickness of the multilayer film (the silicon dioxide film 7, the silicon nitride films 8 and 9, and the like) composing the vibrating film 30 leads to control of the resonance frequency f of the vibrating film 30.

It should be noted that it is preferable that the silicon dioxide film 7 is set smaller in shape in plan than, for example, the quadratic film to be the vibrating film 30 and is arranged at the central part of the vibrating film 30. This allows the silicon dioxide film 7 which is to be an electret to be used as a mass (a weight) in the vibrating film 30, enhancing the sensitivity of the electret condenser 2 of the present embodiment. Further, the film thickness of the multilayer film composing the vibrating film 30 can be reduced in a region where the silicon dioxide film 7 is not formed.

Moreover, in the present embodiment, the silicon dioxide film 7 is used as an electret, but the electret may be another insulating film made of polytetrafluoroethylene, FEP, or the like.

In addition, the silicon nitride films 8 and 9 are used as the insulating films for covering the electret formed of die silicon dioxide film 7 in the present embodiment but other insulting films made of polyimide, benzocyclobutene, or the like may be used instead.

INDUSTRIAL APPLICABILITY

The present invention relates to an electret condenser having a vibrating electrode. When applied to an electret condenser formed using a MEMS technology, the present invention can achieve an effect of providing a device, especially an ECM, excellent in reliability, such as moisture resistance, thermal resistance, and the like and, therefore, is very useful.

The invention claimed is:

1. An electret condenser, comprising:
   a first electrode which is a fixed electrode;
   a second electrode;
   a lower insulating film formed on the second electrode;
   a first insulating film which is formed on the lower insulating film between the first electrode and the second electrode and is electretized, an air gap being formed between the first insulating film and the first electrode;
   a second insulating film formed so as to cover upper-lower and side surfaces of the first insulating film,
   the second electrode, the lower insulating film, the first insulating film, and the second insulating film compose a vibrating film,
   the second insulating film touches at least one of the upper and side surfaces of the first insulating film, and
   the lower insulating film and the second insulating film are silicon nitride films.

2. The electret condenser of claim 1,
   wherein the first insulting film is a silicon dioxide film grown in an atmosphere at a temperature in a range between 500° C. and 800° C., both inclusive.

3. The electret condenser of claim 1,
   wherein the lower insulating film and the second insulting film grown in an atmosphere at a temperature in the range between 600° C. and 800° C., both inclusive.

4. The electret condenser of claim 1,
   wherein a shape in plan of the first insulating film is smaller than a shape in plan of the vibrating film, and
   the first insulating film is arranged at a central part of the vibrating film.

5. The electret condenser of claim 1,
   wherein the second insulating film touches the upper and side surfaces of the first insulating film.

6. An electret condenser, comprising:
   a first electrode which is fixed electrode;
   a second electrode;
   a first insulating film which is formed on the second electrode between the first electrode and the second electrode and is electretized, an air gap being formed between the first insulating film and the first electrode; and
   a second insulating film formed on the first insulating film so as to cover upper and side surfaces of the first insulating film,
   wherein
   the second electrode, the first insulating film, and the second insulating film compose a vibrating film,
   the second insulating film touches at least one of the upper and side surfaces of the first insulating film and
   the second insulating film is a silicon nitride film.

7. The electret condenser of claim 6,
   wherein the first insulting film is a silicon dioxide film grown in an atmosphere at a temperature in a range between 500° C. and 800° C., both inclusive.

8. The electret condenser of claim 6,
   wherein the second insulting film is a silicon nitride film grown in an atmosphere at a temperature in the range between 600° C. and 800° C., both inclusive.

9. The electret condenser of claim 6,
   wherein a shape in plan of the first insulating film is smaller than a shape in plan of the vibrating film, and
   the first insulating film is arranged at a central part of the vibrating film.

10. The electret condenser of claim 6,
    wherein the second insulating film touches the upper and side surfaces of the first insulating film.

11. The electret condenser of claim 6,
    wherein the second insulating film touches the upper and side surfaces of the first insulating film, and
    the second electrode touches the lower surface of the first insulating film.

12. An electret condenser, comprising:
    a first electrode;
    a second electrode;
    a first insulating film which is formed between the first electrode and the second electrode and is electretized; and
    a second insulating film formed so as touch all of upper, lower and side surfaces of the first insulating film,
    wherein the second insulating film is a silicon nitride film.

13. The electret condenser of claim 12,
    wherein the first insulating film is formed on the second electrode.

14. The electret condenser of claim 12,
    wherein at least one of the first electrode and the second electrode is included in a vibrating film.

15. The electret condenser of claim 12,
    wherein the first insulating film is made of silicon dioxide.

* * * * *